(12) United States Patent
Yang et al.

(10) Patent No.: US 12,068,598 B2
(45) Date of Patent: Aug. 20, 2024

(54) POWER SUPPLY CIRCUIT AND POWER SUPPLYING METHOD

(71) Applicant: Realtek Semiconductor Corporation, Hsinchu (TW)

(72) Inventors: Ching-Lan Yang, Hsinchu (TW); Zong-Da Huang, Hsinchu (TW); Chun-Yuan Huang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 179 days.

(21) Appl. No.: 17/655,794

(22) Filed: Mar. 22, 2022

(65) Prior Publication Data
US 2022/0416537 A1 Dec. 29, 2022

(30) Foreign Application Priority Data
Jun. 25, 2021 (TW) ................. 110123390

(51) Int. Cl.
*H03K 19/20* (2006.01)
*H02J 1/00* (2006.01)

(52) U.S. Cl.
CPC .............. *H02J 1/001* (2020.01); *H03K 19/20* (2013.01)

(58) Field of Classification Search
CPC .... H02J 1/001; H03K 19/20; H01J 37/32192; G06F 13/4081; G06F 1/266; G06F 13/4022; G06F 1/26; G06F 1/24; G06F 2213/0042; G06F 1/3287; G06F 13/4282; G09G 5/006; G09G 2330/02; G09G 2370/12; G09G 2330/026; G09G 3/2096; G09G 2330/021; G09G 2370/10; G09G 2370/08; G09G 2370/22; G09G 5/008; G09G 2330/028; G09G 3/2092; G09G 2370/14; G09G 2370/047

See application file for complete search history.

(56) References Cited

U.S. PATENT DOCUMENTS

| | | | | |
|---|---|---|---|---|
| 8,059,673 B2* | 11/2011 | Kobayashi | ................ | G06F 3/14 370/465 |
| 2014/0175889 A1* | 6/2014 | Feng | ...................... | H01R 29/00 307/82 |
| 2014/0232939 A1* | 8/2014 | Kabuto | .................... | H04N 5/38 348/723 |
| 2020/0005964 A1* | 1/2020 | Chen | .................... | H01B 7/0892 |

FOREIGN PATENT DOCUMENTS

| CN | 112015688 A | 12/2020 |
|---|---|---|
| TW | 285370 | 9/1996 |

* cited by examiner

Primary Examiner — John W Poos
(74) Attorney, Agent, or Firm — CKC & Partners Co., LLC

(57) ABSTRACT

A power supply circuit is configured to supply power to a display panel. The power supply circuit includes a receiver circuit and a transmitter circuit. The receiver circuit is configured to couple the display panel and output a hot plugging signal. The transmitter circuit is configured to receive the hot plugging signal and couple a power circuit. The transmitter circuit is further configured to communicate the receiver circuit to generate an enable signal. The hot plugging signal and the enable signal are configured to control whether a first voltage signal from the power circuit is transmitted to the receiver circuit and the display panel via the transmitter circuit.

20 Claims, 3 Drawing Sheets

POWER SUPPLY CIRCUIT AND POWER SUPPLYING METHOD

RELATED APPLICATIONS

This application claims priority to Taiwan Application Serial Number 110123390, filed Jun. 25, 2021, which is herein incorporated by reference.

BACKGROUND

Technical Field

The present disclosure relates to a power supply technology, more particularly, a power supply circuit and a power supplying method suitable for separate televisions.

Description of Related Art

With developments of technology, electronic devices with good looking and smaller size are pursued. Taking televisions as examples, traditional all-in-one televisions are gradually replaced by separate televisions. However, in some related arts, separate televisions can have no protection for high-voltage supply, and it can result in risks such as high-voltage arcs, burnout of equipment, and electric shock, etc.

SUMMARY

Some aspects of the present disclosure are to provide a power supply circuit. The power supply circuit is configured to supply power to a display panel. The power supply circuit includes a receiver circuit and a transmitter circuit. The receiver circuit is configured to couple the display panel and output a hot plugging signal. The transmitter circuit is configured to receive the hot plugging signal and couple a power circuit. The transmitter circuit is further configured to communicate the receiver circuit to generate an enable signal. The hot plugging signal and the enable signal are configured to control whether a first voltage signal from the power circuit is transmitted to the receiver circuit and the display panel via the transmitter circuit.

Some aspects of the present disclosure are to provide a power supplying method. The power supplying method includes following operations: outputting, by a receiver circuit, a hot plugging signal; receiving, by a transmitter circuit, the hot plugging signal; communicating, by the transmitter circuit, with the receiver circuit to generate an enable signal; and controlling whether a first voltage signal from a power circuit is transmitted to the receiver circuit and a display panel via the transmitter circuit according to the hot plugging signal and the enable signal.

Based on the descriptions above, the power supply circuit and the power supplying method can utilize the hot plugging signal and the enable signal to control the transmitter circuit to output the voltage signal (e.g., relative high voltage signal) from the power circuit under a condition that the transmission cable is connected and the confirm process between the transmitter circuit and the receiver circuit is finished. Accordingly, the risks such as high-voltage arcs, burnout of equipment, and electric shock can be reduced.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
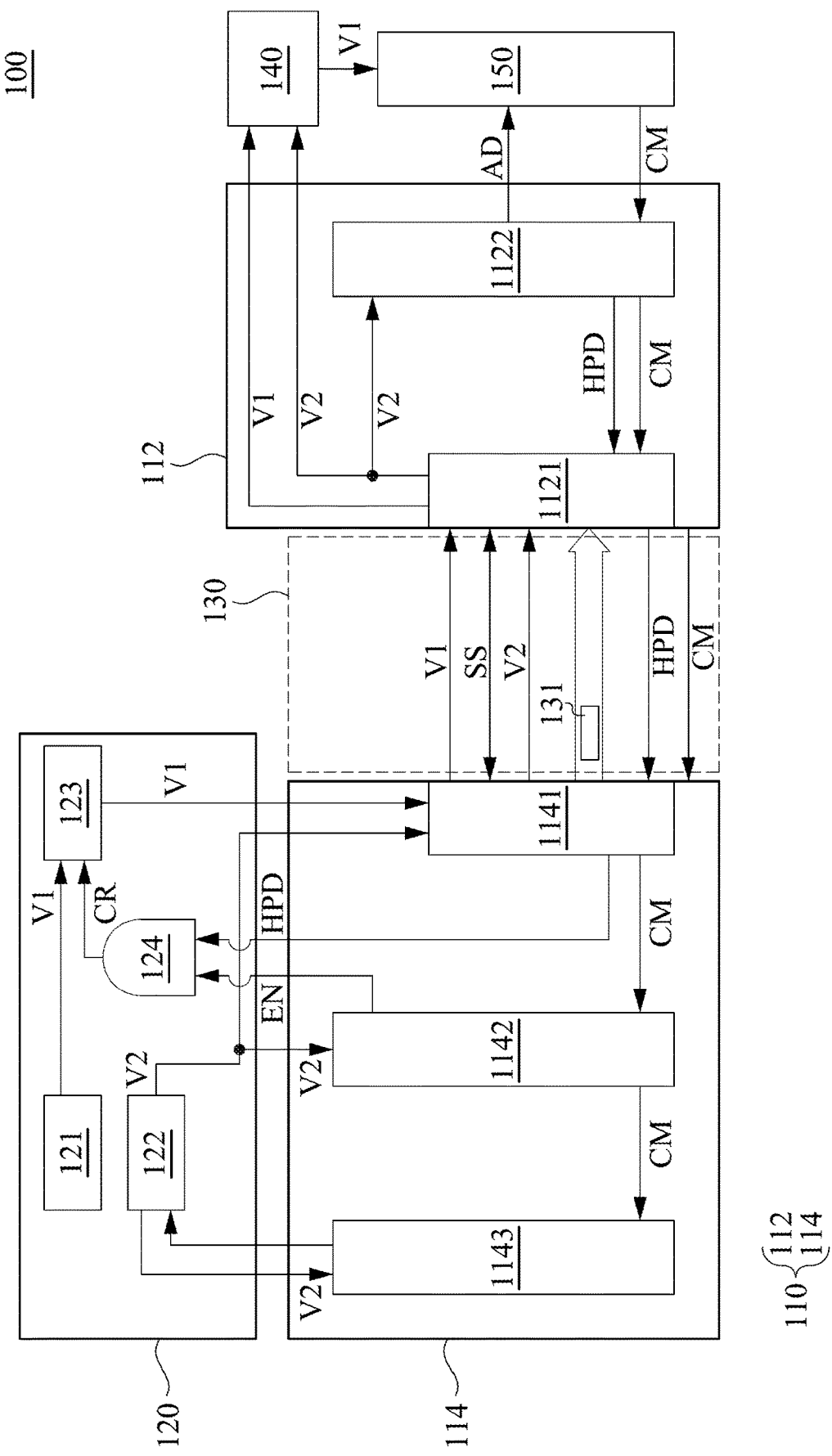
FIG. 1 is a schematic diagram illustrating a display system according to some embodiments of the present disclosure.

Reference is made to FIG. 1. FIG. 1 is a schematic diagram illustrating a display system 100 according to some embodiments of the present disclosure.

As illustrated in FIG. 1, the display system 100 includes a power supply circuit 110, a power circuit 120, a transmission cable 130, a switch circuit 140, and a display panel 150.

In some embodiments, the display panel 150 can be a liquid display panel. The power supply circuit 110 can work with the power circuit 120, the transmission cable 130, and the switch circuit 140 to supply power to the display panel 150 so as to light up a backlight module or other modules in the display panel 150.

The implementation of the display panel 150 is merely for illustration, but the present disclosure is not limited thereto. Various display panels are within the contemplated scopes of the present disclosure.

As illustrated in FIG. 1, the power supply circuit 110 includes a receiver circuit 112 and a transmitter circuit 114. The receiver circuit 112 is coupled to the switch circuit 140 and the display panel 150. The transmitter circuit 114 is coupled to the power circuit 120. The receiver circuit 112 and the transmitter circuit 114 can be coupled to each other via the transmission cable 130.

In some embodiments, the receiver circuit 112 can be disposed on a printed circuit board. The receiver circuit 112, the switch circuit 140, and the display panel 150 can be integrated into a display device. The transmitter circuit 114 and the power circuit 120 can be disposed on another printed circuit board and integrated into a host device. The host device (including transmitter circuit 114 and the power circuit 120) can be coupled to the display device (including the receiver circuit 112, the switch circuit 140, and the display panel 150) via the transmission cable 130 to transmit power and video data to the display device. With such configuration, the display system 100 is a separate display system (e.g., a separate television) which includes the host device and the display device. Compared to traditional display apparatuses, the separate display system has a relative longer distance between the host device and the display device. In addition, in the separate display system, the thickness of the display device can be reduced, and it occupies a relative small space and has a good looking.

In some other embodiments, the transmitter circuit 114 and the power circuit 120 can be disposed on different printed circuit boards respectively but integrated into one host device. In addition, in some embodiments, the transmission cable 130 satisfies inter-integrated circuit (I²C) standard, but the present disclosure is not limited thereto.

As illustrated in FIG. 1, the receiver circuit 112 includes a connector 1121 and a chip 1122. The connector 1121 is coupled to the chip 1122 and the switch circuit 140. The chip 1122 and the switch circuit 140 are coupled to the display panel 150. In some embodiments, the chip 1122 can include an analog-to-digital converter. The receiver circuit 112 in FIG. 1 is merely for illustration, and the present disclosure is not limited thereto. In some embodiments, the switch circuit 140 can be disposed in the receiver circuit 112.

As illustrated in FIG. 1, the transmitter circuit 114 includes a connector 1141, a chip 1142, and a processor circuit 1143. The connector 1141 and the connector 1121 can be coupled to each other via the transmission cable 130. The chip 1142 is coupled to the connector 1141 and the processor circuit 1143. In some embodiments, the chip 1142 can include a digital-to-analog converter. In some embodiments, the processor circuit 1143 can be a TV SoC.

The power circuit 120 includes a power source 121, a power source 122, a switch circuit 123 and an AND gate 124. The power source 121 is coupled to the switch circuit 123, and the switch circuit 123 is coupled to the connector 1141. Effectively, the switch circuit 123 is coupled between the power source 121 and the connector 1141. The power source 122 is coupled to the connector 1141, the chip 1142, and the processor circuit 1143. Two input terminals of the AND gate 124 are coupled to the connector 1141 and the chip 1142 respectively, and an output terminal of the AND gate 124 is coupled to the switch circuit 123.

Figure 2:
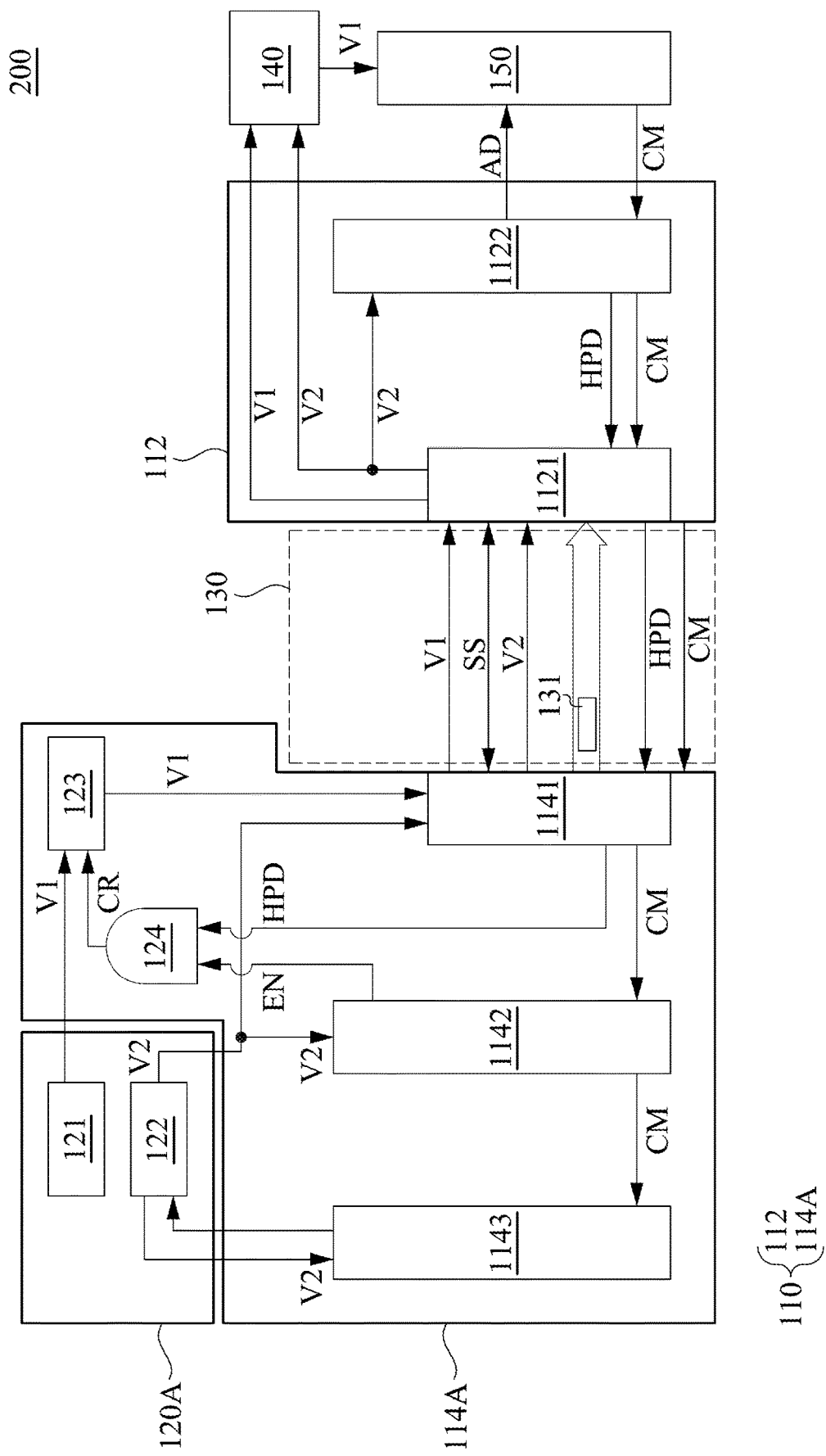
FIG. 2 is a schematic diagram illustrating a display system according to some embodiments of the present disclosure.

The power circuit 120 in FIG. 1 is merely for illustration, and the present disclosure is not limited thereto. In some embodiments, the switch circuit 123 and/or the AND gate 124 can be disposed outside the power circuit 120. Reference is made to FIG. 2. FIG. 2 is a schematic diagram illustrating a display system 200 according to some embodiments of the present disclosure. In some further embodiments, the switch circuit 123 and the AND gate 124 are disposed outside a power circuit 120A and disposed in a transmitter circuit 114A. Other elements in the display system 200 in FIG. 2 are similar to the elements in the display system 100 in FIG. 1.

Reference is made to FIG. 1 again. In some embodiments, the power source 121 is a relative high-voltage power source, and the power source 122 is a relative low-voltage power source. To be more specific, the power source 121 is configured to provide a voltage signal V1, the power source 122 is configured to provide a voltage signal V2, and a voltage value of the voltage signal V1 is greater than a voltage value of the voltage signal V2. For example, the voltage value of the voltage signal V1 can be greater than 100 volts (e.g., in a range between 100 volts to 450 volts), and the voltage value of the voltage signal V2 can be substantially 12 volts.

The aforementioned voltage values of the voltage signal V1 and the voltage signal V2 are for illustration, and the present disclosure is not limited thereto. Various suitable voltage values are within the contemplated scopes of the present disclosure.

In operation, when a user uses a control device (e.g., a remote control) to turn on the display system 100, the chip 1122 in the receiver circuit 112 receives a boot command CM. The chip 1122 transmits the boot command CM to the chip 1142 via the connector 1121, the transmission cable 130, and the connector 1141. Then, the chip 1142 transmits the boot command CM to the processor circuit 1143. The processor circuit 1143 can enable the power source 122 according to the boot command CM.

After the power source 122 is enabled, the power source 122 can output the voltage signal V2 to the connector 1141, the chip 1142, and the processor circuit 1143 to supply power to the chip 1142 and the processor circuit 1143. The connector 1141 can output the voltage signal V2 to the connector 1121 via the transmission cable 130. Then, the connector 1121 can output the voltage signal V2 to the chip 1122 and the switch circuit 140 in order to supply power to the chip 1122 and to turn on the switch circuit 140. In addition, the powered chip 1122 can output video data AD to the display panel 150 via a transmission element. This transmission element is, for example, a transmission line with V-by-1 standard, but the present disclosure is not limited thereto.

When the receiver circuit 112 operates normally and the transmission cable 130 is plugged between the connector 1121 and the connector 1141, the chip 1122 can output a hot plugging signal HPD with a logic value 1. Since the transmission cable 130 is normally coupled between the connector 1121 and the connector 1141, the connector 1121 can output the hot plugging signal HPD to the connector 1141 via the transmission cable 130. Then, the connector 1141 can output the hot plugging signal HPD to the first input terminal of the AND gate 124.

In addition, the transmitter circuit 114 can communicate with the receiver circuit 112 via the transmission cable 130 to generate an enable signal EN. For example, the chip 1142 can perform a confirm process on the chip 1122 via the connector 1141, a transmission element SS in the transmission cable 130, and the connector 1121 to confirm whether the transmitter circuit 114 and the receiver circuit 112 are connected. In addition, the chip 1142 can perform another confirm process on a memory 131 in the transmission cable 130 via the connector 1141 to determine a type of the transmission cable 130 (a type which the receiver circuit 112 can support) according to information stored in the memory 131. After the aforementioned confirm processes are finished, the chip 1142 can generate the enable signal EN with a logic value 1. Then, the chip 1142 can output the enable signal EN to the second input terminal of the AND gate 124.

In some embodiments, the memory 131 can be an electrically-erasable programmable read-only memory (EEPROM). In some embodiments, as described above, the transmission cable 130 satisfies $I^2C$ standard. In other words, in these embodiments, the transmission element SS in the transmission cable 130 can include two signal lines (SDA/SCL lines).

Then, the AND gate 124 can perform an AND calculation on the hot plugging signal HPD and the enable signal EN to generate a control signal CR. For example, the AND gate 124 can perform the AND calculation on the hot plugging signal HPD with the logic value 1 and the enable signal EN with the logic value 1 to generate the control signal CR with a logic value 1. The control signal CR with the logic value 1 can turn on the switch circuit 123.

When the switch circuit 123 is turned on, the voltage signal V1 can be outputted to the transmitter circuit 114, the receiver circuit 112, the switch circuit 140, and the display panel 150 via the switch circuit 123. To be more specific, when the switch circuit 123 is turned on, the voltage signal V1 can be outputted to the connector 1141 via the turned-on switch circuit 123. The connector 1141 can output the voltage signal V1 to the connector 1121 via the transmission cable 130. Then, the connector 1121 can output the voltage signal V1 to the switch circuit 140.

As described above, the switch circuit 140 can be turned on according to the voltage signal V2. The turned-on switch circuit 140 can output the voltage signal V1 to the display panel 150 to supply power to the display panel 150 so as to light up the backlight module in the display panel 150.

Compared to some related arts, the switch circuit 123 in the present disclosure is controlled by the logic value of the hot plugging signal HPD and the logic value of the enable signal EN. When both of the hot plugging signal HPD and the enable signal EN have the logic value 1 (the transmission cable 130 is plugged between the connector 1121 and the connector 1141, and the confirm process between the transmitter circuit 114 and the receiver circuit 112 is finished), the control signal CR has the logic value 1 to turn on the switch circuit 123 to output the relative high voltage signal V1 to the connector 1141. Accordingly, the risks such as high-voltage arcs, burnout of equipment, and electric shock can be reduced.

In some embodiments, the switch circuit 123 can be implemented by one or more relays or high-voltage transistors. When the switch circuit 123 is implemented by a P-type transistor, an additional heat sink can be used to avoid burnout due to power-on for a long time.

In some embodiments, the switch circuit 140 can be implemented by one or more relays or high-voltage diodes. The switch circuit 140 can be used to avoid reversal of current from the display panel 150. In some other embodiments, when a power circuit in the display panel 150 excludes a capacitor (power storage element) with a relative larger capacitance value, the switch circuit 140 can be removed to reduce the cost.

Figure 3:
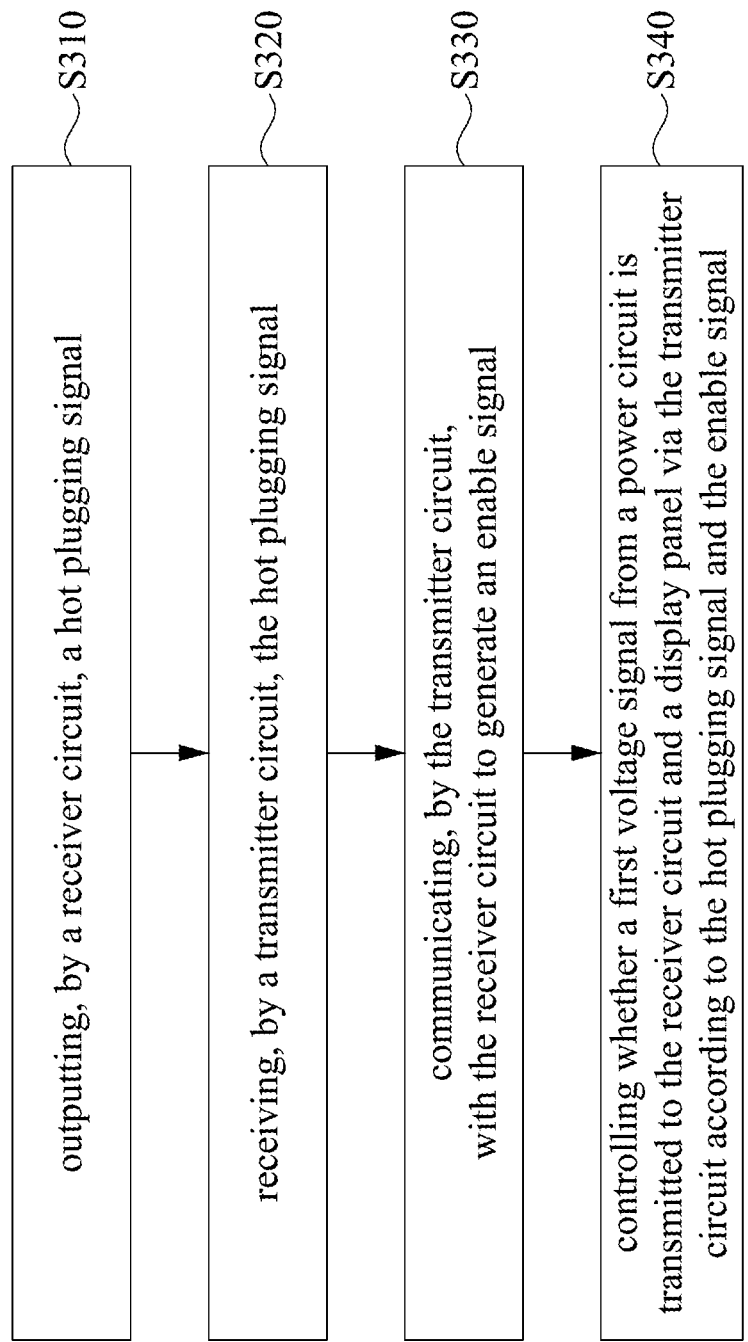
FIG. 3 is a schematic diagram illustrating a power supplying method according to some embodiments of the present disclosure.

Reference is made to FIG. 3. FIG. 3 is a schematic diagram illustrating a power supplying method 300 according to some embodiments of the present disclosure. The power supplying method 300 includes operations S310, S320, S330, and S340. In some embodiments, the power supplying method 300 is applied to the display system 100 in FIG. 1 or the display system 200 in FIG. 2, but the present disclosure is not limited thereto. However, for better understanding, the power supplying method 300 in FIG. 3 is described with reference to the display system 100 in FIG. 1.

In operation S310, the receiver circuit 112 outputs the hot plugging signal HPD. In some embodiments, when the receiver circuit 112 operates normally and the transmission cable 130 is plugged between the connector 1121 and the connector 1141, the chip 1122 can output the hot plugging signal HPD with the logic value 1.

In operation S320, the transmitter circuit 114 receives the hot plugging signal HPD. In some embodiments, the connector 1121 of the receiver circuit 112 can output the hot plugging signal HPD to the connector 1141 of the transmitter circuit 114 via the transmission cable 130.

In operation S330, the transmitter circuit 114 communicates with the receiver circuit 112 to generate the enable signal EN. In some embodiments, the transmitter circuit 114 communicates with the receiver circuit 112 via the transmission cable 130 to generate the enable signal EN.

In operation S340, the hot plugging signal HPD and the enable signal EN are configured to control whether the voltage signal V1 from the power circuit 120 is outputted to the receiver circuit 112 and the display panel 150 via the transmitter circuit 114. In some embodiments, the AND gate 124 can perform the AND calculation on the hot plugging signal HPD and the enable signal EN to generate the control signal CR. When the switch circuit 123 is turned on according to the control signal CR, the voltage signal V1 can be outputted to the receiver circuit 112 and the display panel 150 via the turned-on switch circuit 123 and the transmitter circuit 114.

Based on the descriptions above, the power supply circuit and the power supplying method can utilize the hot plugging signal and the enable signal to control the transmitter circuit to output the voltage signal (e.g., relative high voltage signal) from the power circuit under a condition that the transmission cable is connected and the confirm process between the transmitter circuit and the receiver circuit is finished. Accordingly, the risks such as high-voltage arcs, burnout of equipment, and electric shock can be reduced.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power supply circuit configured to supply power to a display panel, wherein the power supply circuit comprises:
   a receiver circuit configured to couple the display panel and output a hot plugging signal; and
   a transmitter circuit configured to receive the hot plugging signal and couple a power circuit, wherein the transmitter circuit is further configured to communicate the receiver circuit to generate an enable signal,
   wherein the hot plugging signal and the enable signal are configured to control whether a first voltage signal from the power circuit is transmitted to the receiver circuit and the display panel via the transmitter circuit.

2. The power supply circuit of claim 1, wherein the power circuit comprises:
   a first power source configured to provide the first voltage signal;
   a second power source configured to provide a second voltage signal, wherein a voltage value of the first voltage signal is higher than a voltage value of the second voltage signal;
   a first switch circuit coupled between the first power source and the transmitter circuit; and
   an AND gate configured to generate a control signal according to the hot plugging signal and the enable signal to control the first switch circuit to be tuned on or turned off, wherein when the first switch circuit is turned on, the turned-on first switch circuit is configured to output the first voltage signal to the transmitter circuit.

3. The power supply circuit of claim 2, wherein the voltage value of the first voltage signal is higher than 100 volts, and the voltage value of the second voltage signal is substantially 12 volts.

4. The power supply circuit of claim 2, wherein the transmitter circuit comprises:
   a first connector configured to couple the first switch circuit and receive the first voltage signal from the first switch circuit, and configured to output the hot plugging signal from the receiver circuit to the AND gate;
   a first chip configured to generate the enable signal and output the enable signal to the AND gate; and
   a processor circuit configured to enable the second power source, wherein the second power source is configured to output the second voltage signal to the first connector, the first chip, and the processor circuit.

5. The power supply circuit of claim 4, wherein the receiver circuit comprises:
   a second connector configured to receive the first voltage signal and the second voltage signal; and
   a second chip configured to output the hot plugging signal to the second connector,
   wherein the second connector is configured to output the second voltage signal to the second chip, and output the second voltage signal to a second switch circuit coupled to the display panel to control the second switch circuit to be turned on or turned off,
   wherein when the second switch circuit is turned on, the turned-on second switch circuit is configured to output the first voltage signal from the second connector to the display panel.

6. The power supply circuit of claim 5, wherein the first switch circuit is implemented by a relay or a transistor, wherein the second switch circuit is implemented by a relay or a diode.

7. The power supply circuit of claim 5, further comprising:
   a transmission cable coupled between the first connector and the second connector.

8. The power supply circuit of claim 7, wherein when the transmitter circuit finishes a first confirm process on the receiver circuit and finishes a second confirm process on the transmission cable, the first chip generates the enable signal.

9. The power supply circuit of claim 8, wherein the transmission cable comprises:
   a memory, wherein the first chip performs the second confirm process to determine a type of the memory according to information stored in the memory.

10. The power supply circuit of claim 1, wherein the power circuit comprises a first power source and a second power source, the first power source is configured to provide the first voltage signal, the second power source is configured to provide a second voltage signal, and a voltage value of the first voltage signal is higher than a voltage value of the second voltage signal, wherein the transmitter circuit comprises:
    a first switch circuit coupled to the first power source; and
    an AND gate configured to generate a control signal according to the hot plugging signal and the enable signal to control the first switch circuit to be tuned on or turned off, wherein when the first switch circuit is turned on, the turned-on first switch circuit is configured to output the first voltage signal.

11. The power supply circuit of claim 10, wherein the voltage value of the first voltage signal is higher than 100 volts, and the voltage value of the second voltage signal is substantially 12 volts.

12. The power supply circuit of claim 10, wherein the transmitter circuit comprises:
    a first connector configured to couple the first switch circuit and receive the first voltage signal from the first switch circuit, and configured to output the hot plugging signal from the receiver circuit to the AND gate;
    a first chip configured to generate the enable signal and output the enable signal to the AND gate; and
    a processor circuit configured to enable the second power source, wherein the second power source is configured to output the second voltage signal to the first connector, the first chip, and the processor circuit.

13. The power supply circuit of claim 12, wherein the receiver circuit comprises:
    a second connector configured to receive the first voltage signal and the second voltage signal; and
    a second chip configured to output the hot plugging signal to the second connector,
    wherein the second connector is configured to output the second voltage signal to the second chip, and output the second voltage signal to a second switch circuit coupled to the display panel to control the second switch circuit to be turned on or turned off,
    wherein when the second switch circuit is turned on, the turned-on second switch circuit is configured to output the first voltage signal from the second connector to the display panel.

14. The power supply circuit of claim 13, wherein the first switch circuit is implemented by a relay or a transistor, wherein the second switch circuit is implemented by a relay or a diode.

15. The power supply circuit of claim 13, further comprising:
    a transmission cable coupled between the first connector and the second connector.

16. The power supply circuit of claim 15, wherein when the transmitter circuit finishes a first confirm process on the receiver circuit and finishes a second confirm process on the transmission cable, the first chip generates the enable signal.

17. The power supply circuit of claim 16, wherein the transmission cable comprises:
    a memory, wherein the first chip performs the second confirm process to determine a type of the memory according to information stored in the memory.

18. A power supplying method comprising:
    outputting, by a receiver circuit, a hot plugging signal;
    receiving, by a transmitter circuit, the hot plugging signal;
    communicating, by the transmitter circuit, with the receiver circuit to generate an enable signal; and
    controlling whether a first voltage signal from a power circuit is transmitted to the receiver circuit and a display panel via the transmitter circuit according to the hot plugging signal and the enable signal.

19. The power supplying method of claim 18, further comprising:
    providing, by a first power source in the power circuit, the first voltage signal;
    providing, by a second power source in the power circuit, a second voltage signal, wherein a voltage value of the first voltage signal is higher than a voltage value of the second voltage signal;
    generating, by an AND gate in the power circuit, a control signal according to the hot plugging signal and the enable signal to control a first switch circuit in the power circuit to be turned on or turned off; and
    outputting, by the turned-on first switch circuit, the first voltage signal to the transmitter circuit.

20. The power supplying method of claim 18, further comprising:
    providing, by a first power source in the power circuit, the first voltage signal;

providing, by a second power source in the power circuit, a second voltage signal, wherein a voltage value of the first voltage signal is higher than a voltage value of the second voltage signal;

generating, by an AND gate in the transmitter circuit, a control signal according to the hot plugging signal and the enable signal to control a first switch circuit in the transmitter circuit to be turned on or turned off, and outputting, by the turned-on first switch circuit, the first voltage signal.

* * * * *